United States Patent [19]

Iwata et al.

[11] 4,220,874
[45] Sep. 2, 1980

[54] HIGH FREQUENCY SEMICONDUCTOR DEVICES

[75] Inventors: Yutaka Iwata; Seiichi Takahashi; Katsuzo Kaminishi, all of Tokyo, Japan

[73] Assignee: Oki Electric Industry Co., Ltd., Tokyo, Japan

[21] Appl. No.: 880,158

[22] Filed: Feb. 22, 1978

[30] Foreign Application Priority Data

Feb. 15, 1977 [JP] Japan .................................. 52-14598
Oct. 24, 1977 [JP] Japan ................................ 52-126754

[51] Int. Cl.² .......................................... H03K 17/58
[52] U.S. Cl. .................................... 307/256; 307/254; 307/317 R; 307/237
[58] Field of Search ............... 307/256, 259, 254, 237, 307/317 R; 333/7

[56] References Cited

U.S. PATENT DOCUMENTS

| | | | |
|---|---|---|---|
| 3,183,373 | 5/1965 | Sakarai | 307/259 |
| 3,459,969 | 8/1969 | Jasper | 307/256 |
| 3,475,700 | 10/1969 | Ertel | 307/259 |

Primary Examiner—John Zazworsky
Assistant Examiner—B. P. Davis
Attorney, Agent, or Firm—Wenderoth, Lind & Ponack

[57] ABSTRACT

The high frequency semiconductor device of the present comprises a pair of diodes and a transfer switch. The anode electrodes of the diodes are connected together and the transfer switch operates to connect the cathode electrode of one diode to ground and the cathode electrode of the other diode to a voltage source so as to forwardly bias one diode and reversely bias the other diode. By the selective operation of the transfer switch, the device operates either as a switch for passing high frequency signals or as an attenuator for high frequency signals.

8 Claims, 7 Drawing Figures

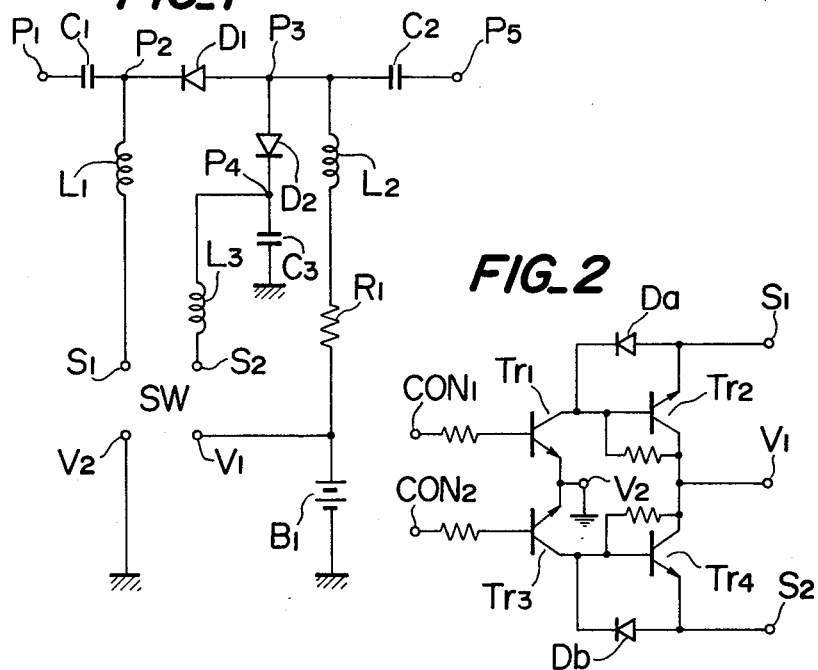

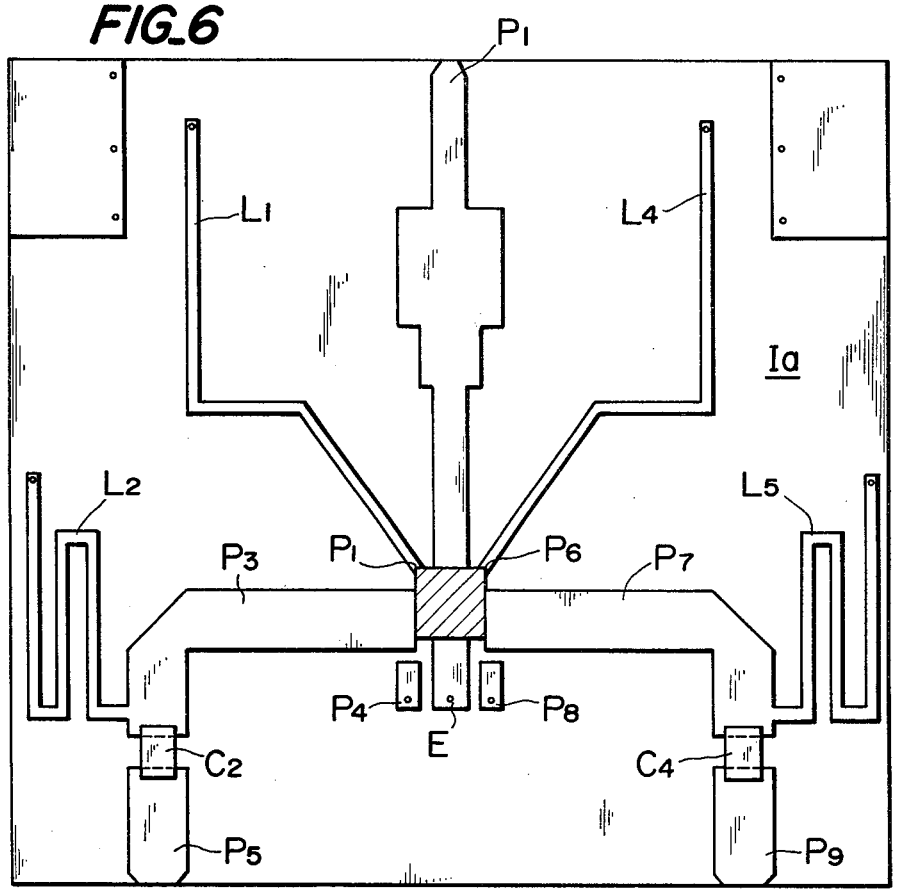
FIG_6
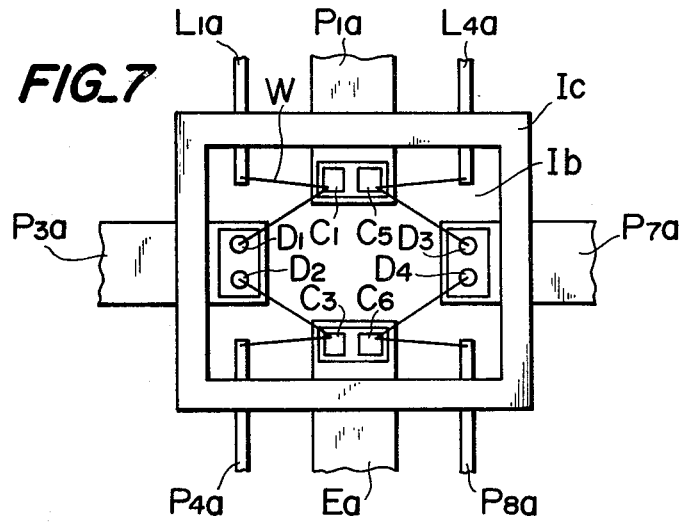
FIG_7

HIGH FREQUENCY SEMICONDUCTOR DEVICES

BACKGROUND OF THE INVENTION

This invention relates to a semiconductor device suitable for operation as a switch or an attenuator in a ultra high frequency band which can reduce the necessary driving power and manufacturing cost and has an increased reliability.

Among diode types which can operate as switches, attenuators, etc. in ultra high frequency bands may be mentioned the pin diode. At its operating frequency the junction capacitance of a diode of this type is determined by the thickness of the intrinsic layer (i layer) and the junction area only, its reactance component does not depend upon the applied voltage and is constant. Accordingly, in order to use such a pin diode as a switch, attenuator, etc., it is necessary to apply a bias voltage in only the forward direction, and it is not necessary to apply a reverse bias for the purpose of decreasing insertion loss, because the junction capacitance of the pin diode does not depend upon the applied voltage. However, when it is used as a switch, the degree of isolation and attenuation is solely determined by the forward resistance of the diode so that it is necessary to decrease this resistance in order to increase the effectiveness. Accordingly, where a diode having a large resistance for a small current is used, there is a disadvantage because the driving power is increased.

This is caused by the characteristic that the reactance component of the pin diode does not depend upon the voltage at the operating frequency. More particularly, in the pin diode, it is necessary to select a value of specific resistance of the i layer which is sufficiently higher than the value determined by the operating frequency in order to satisfy this characteristic of the pin diode, for example 160 ohm/cm at 10 GHz and 16 ohm/cm at 10 GHz (both of these resistance values are the necessary minimum values). With the present day techniques, because it is difficult to epitaxially grow an i layer having a high specific resistance at a high yield, a substrate having a high specific resistance is used and boron or phosphor is diffused into opposite sides thereof to obtain the semiconductor element. With this method, however, it is extremely difficult to control the thickness of the i layer to be less than $10\mu$. On the other hand, since the resistance of the diode is proportional to the square of the thickness of the i layer and inversely proportional to the magnitude of current, the resistance of the diode which is prepared by the method described above becomes large at a small current.

Although there has been proposed a method wherein an epitaxially grown wafer is used, and an over punch through is formed at a diffusion potential for eliminating the voltage dependency of the reactance component, with this method since the junction capacitance is constant and hence the thickness of the i layer is small, in order to obtain a characteristic necessary for the pin diode, the junction area becomes small and hence the thermal resistance becomes high with the result that it becomes impossible to handle large power.

SUMMARY OF THE INVENTION

Accordingly, it is an object of this invention to provide an improved semiconductance device having a small resistance for small current for reducing the required driving power, and having a low price and high reliability which can be used as a switch, an attenuator, or the like in an ultra high frequency band.

Briefly stated, the high frequency semiconductor device of this invention comprises a pair of diodes and a transfer switch. The anode (or cathode) electrodes of the diodes are connected together and the transfer switch operates to connect the cathode (or anode) electrode of one diode to the ground and the cathode (or anode) electrode of the other diode to a voltage source so as to forwardly bias one diode and reversely bias the other diode simultaneously. By the selective operation of the transfer switch the device operates as a switch for passing high frequency signals or as an attenuator thereof.

According to this invention, there is provided a high frequency semiconductor device comprising (a) a first capacitor connected between first and second connecting points, (b) a first diode connected between second and third connecting points, (c) a second diode connected between third and fourth connecting points, (d) a second capacitor connected between third and fourth connecting points, (e) a third capacitor connected between the fourth connecting point and a high frequency grounding point, (f) first circuit means including a resistance element connected between the third connecting point and a first potential point, (g) second circuit means connected between the second connecting point and a first switching point, (h) third circuit means for connecting the fourth connecting point and a second switching point, and (i) switching means for selectively connecting one of the first and second switching points to the first potential point and the other switching point to a second potential point.

BRIEF DESCRIPTION OF THE DRAWINGS

Further objects and advantages of the invention can be more fully understood from the following detailed description taken in conjunction with the accompanying drawings in which:

FIG. 1 is a schematic circuit diagram showing a high frequency semiconductor device embodying the invention;

FIG. 2 is a schematic circuit diagram showing a transfer switch utilized in the embodiment shown in FIG. 1;

FIG. 3 is a schematic circuit diagram showing a modified embodiment of the high frequency semiconductor device according to this invention;

FIGS. 6 and 7 are plan views showing further modifications of this invention in which the circuit shown in FIG. 4 is constructed using a high frequency transmission circuit.

DESCRIPTION OF THE PREFERRED EMBODIMENTS

Figure 4:
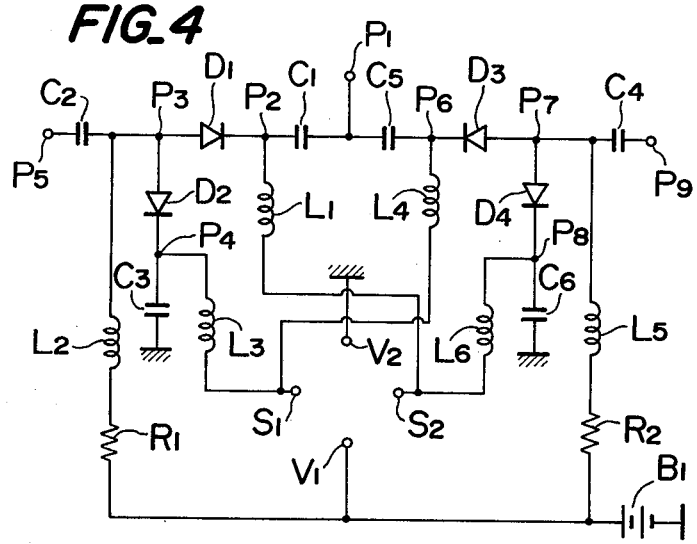
FIG. 4 is a schematic circuit diagram showing a modified high frequency semiconductor device of this invention adapted to be used as a transfer switch.

Preferred embodiments of the invention will be described hereunder with reference to FIGS. 1 through 7. Before describing these embodiments, the basic construction of this invention will first be briefly described. Thus, according to this invention, two diodes and a transfer switch are used. The diodes are connected together at their anode (or cathode) electrodes by a common electrode and the transfer switch operates to connect the cathode (or anode) electrode of one diode to ground and the cathode (or anode) electrode of the other diode to a voltage source. The resistance value of a resistor in the bias circuit is selected such that when either one of the diodes is forwardly biased the other diode will be reversely biased by the potential difference across its terminals. For this reason, it is not necessary to use pin diodes such as described above but other diodes such as varactor diodes could be used. When these diodes are used, the value of the reverse bias is determined according to the operating voltage of the device and these diodes are required to have a junction capacitance that has the desired characteristic at the operating voltage. Consequently, the specific resistance of the i layer is lower than that of the pin diode. For example, the specific resistance decreases from a value higher than 160 ohm/cm to a value higher than 12 12 ohm/cm at 1 GHz, which permits ready manufacture as an epitaxially grown wafer. Where such an epitaxially grown wafer is used, it is possible to decrease the thickness of the i layer as well as the driving power. Furthermore, because the epitaxially grown wafer has an improved crystalline structure the reliability of the element is increased so that such an element is especially suitable for use as an ultra high frequency component part required to have especially high reliability.

The adverse effect upon the ease of adjustment of the Voltage Standing Wave Ratio (V.S.W.R.) caused by the insertion of such an element in a transmission circuit and upon the characteristics caused by the variation in the source voltage can be eliminated by selecting the thickness of the i layer of the element such that punch through occurs at a voltage below the minimum value of the applied voltage. The junction diameter of the diode and the impurity concentration of the i layer are selected to satisfy the characteristics required by the operating voltage and various other parameters. The above description refers to the most basic three terminal element utilizing two diodes but it is also possible to connect such elements in a plurality of stages thereby increasing the number of ports when the element is used as a switch and increasing the attenuation when the element is used as an attenuator.

The embodiments shown in FIGS. 1 through 7 will now be described. FIG. 1 shows a basic connection diagram of the ultra high frequency semiconductor device embodying the invention in which $D_1$ and $D_2$ designate diodes, $C_1$ through $C_3$ capacitors, $L_1$ through $L_3$ inductors, $R_1$ a resistor, $B_1$ a voltage source, SW a transfer switch, $S_1$ and $S_2$ its contacts, $V_1$ a voltage source terminal, $V_2$ a ground terminal, and $P_1$ through $P_5$ connecting terminals of which $P_1$ represents an input terminal and $P_5$ an output terminal. More particularly, as shown in FIG. 1, the anode electrodes of the two diodes $D_1$ and $D_2$ are connected together and the cathode electrode of one diode ($D_1$ or $D_2$) is grounded while the cathode electrode of the other diode ($D_2$ or $D_1$) is connected to voltage source $B_1$ by transfer switch SW. Thus, when one diode is forwardly biased the other diode is reversely biased. For example, when terminal $S_1$ is connected to terminal $V_2$, and terminal $S_2$ is connected to terminal $V_1$, diode $D_1$ is forwardly biased to pass a current expressed by $(V-\phi/R)$, where V represents the voltage of the source $B_1$, $\phi$ the diffusion potential of the diode, R the resistance of resistor $R_1$, whereas the diode $D_2$ is reversely biased by a voltage of $-(V-\phi)$. Under these conditions, microwave power applied to the input terminal $P_1$ reaches the output terminal $P_5$. On the other hand, when terminal $S_1$ is connected to terminal $V_1$ and terminal $S_2$ is connected to terminal $V_2$, bias voltages opposite to those described above are applied across diodes $D_1$ and $D_2$ so that microwave power applied to the input terminal $P_1$ is reflected by diode $D_2$ and does not reach the output terminal $P_5$. With this arrangement, by changing the connections between terminals $S_1$, $S_2$, $V_1$ and $V_2$, the circuit operates as a switch or an attenuator of a microwave signal. Reactors $L_1$ through $L_3$ are used for the purpose of preventing insertion of excessively large high frequency impedance. In the circuit shown in FIG. 1, it is possible to reverse the polarities of diodes $D_1$ and $D_2$ in which case the polarity of the source $B_1$ must also be reversed.

FIG. 2 shows one example of the transfer switch shown in FIG. 1 comprising four transistors $Tr_1$ through $Tr_4$ and two clamp diodes $D_a$ and $D_b$. In FIG. 2, when a positive signal is applied to a control terminal $CON_1$ and a ground potential is applied to the other control terminal $CON_2$ transistors $Tr_1$ and $Tr_4$ are turned ON while transistors $Tr_2$ and $Tr_3$ are turned OFF to interconnect terminal $S_2$ and the source terminal $V_1$ and to interconnect terminal $S_1$ and the ground terminal $V_2$.

On the other hand, when a ground potential is applied to control terminal $CON_1$, and a positive signal is applied to control terminal $CON_2$, the opposite connections are established.

FIG. 3 shows a modified embodiment of this invention which is substantially the same as that shown in FIG. 1 except that the terminal $V_1$ is grounded and the terminal $V_2$ is connected to the source $B_1$.

Figure 5:
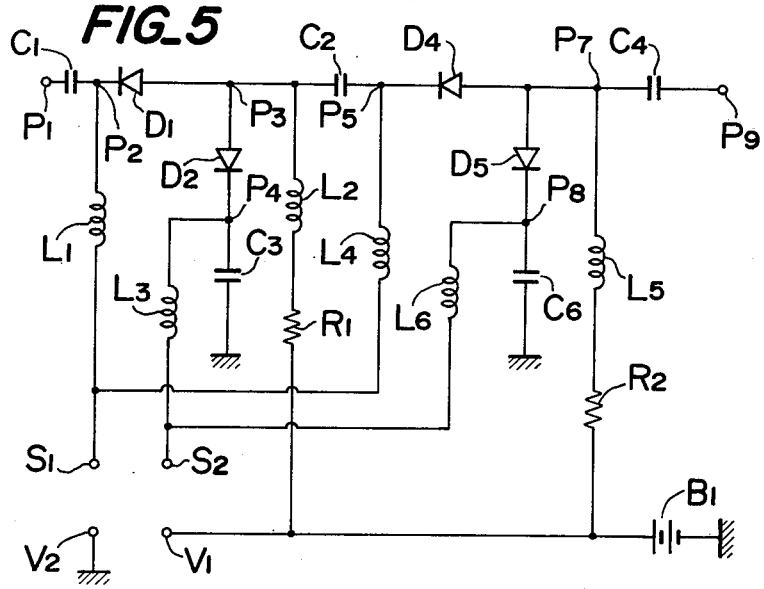
FIG. 5 is a schematic circuit diagram showing still another embodiment of the semiconductor device utilized as an attenuator.

FIGS. 4 and 5 illustrate still further embodiments of this invention. In FIG. 4, two circuits shown in FIG. 1 are connected in parallel to form a transfer switch whereas in the circuit shown in FIG. 5 the two circuits are connected in series to form an attenuator. In FIGS. 4 and 5, elements corresponding to those shown in FIG. 2 are designated by the same reference characters. Capacitors $C_4$ through $C_6$ correspond to capacitors $C_1$ through $C_3$, inductors $L_4$ through $L_6$ to inductors $L_1$ through $L_3$, diodes $D_3$ and $D_4$ to diodes $D_1$ and $D_2$ and resistor $R_2$ to resistor $R_1$. $P_6$ through $P_9$ designate connection terminals. In FIG. 4, terminals $P_5$ and $P_9$ are used as input terminals and $P_1$ as an output terminal whereas in FIG. 5, terminal $P_1$ is used as the input terminal and terminal $P_9$ as the output terminal.

More particularly, in the circuit shown in FIG. 4, when terminals $S_1$ and $V_1$ and terminals $S_2$ and $V_2$ are respectively interconnected, diodes $D_2$ and $D_3$ are reversely biased and diodes $D_1$ and $D_4$ are forwardly biased. Consequently, the microwave power applied to input terminal $P_5$ can reach the output terminal $P_1$, but the microwave power applied to input terminal $P_9$ is reflected and can not reach the output terminal because diode $D_4$ is forwardly biased. On the other hand, when the connections between terminals $S_1$, $S_2$, $V_1$ and $V_2$ are reversed, the opposite action takes place. Thus, the circuit shown in FIG. 4 acts as a transfer switch.

In FIG. 5, when terminal $S_1$ is connected to terminal $V_2$ and terminal $S_2$ is connected to terminal $V_1$, diodes $D_1$ and $D_4$ are forwardly biased while diodes $D_2$ and $D_3$ are reversely biased so that the microwave power applied to input terminal $P_1$ can reach the output terminal $P_9$. However, when the connections between terminals $S_1$, $S_2$, $V_1$ and $V_2$ are reversed, diodes $D_1$ and $D_3$ will be biased forwardly so that the microwave power is reflected by diodes $D_2$ and $D_4$ and can not reach the output terminal $P_9$. Accordingly, the circuit shown in FIG. 5 operates as an attenuator.

FIGS. 6 and 7 show a modified embodiment of this invention wherein the circuit shown in FIG. 4 is realized utilizing a high frequency transmission circuit. Thus, an insulating substrate $I_b$ shown in FIG. 7 is fitted into a recess (shown by a shaded square) of the insulating substrate $I\mu$ shown in FIG. 6 and terminals $L_1$ and $L_{1a}$; $P_1$ and $P_{1a}$; $L_4$ and $L_{4a}$; $P_7$ and $P_{7a}$; $P_8$ and $P_{8a}$; E and $E_a$; $P_4$ and $P_{4a}$; and $P_3$ and $P_{3a}$ are interconnected respectively.

The elements shown in FIG. 6 corresponding to those shown in FIG. 4 are designated by the same reference characters and these elements are formed on the insulating substrate $I_a$. In FIG. 6 inductors $L_1$, $L_2$, $L_4$ and $L_5$ are each formed by a high frequency transmission circuit which is short-circuited (as a high frequency circuit) at points spaced by $\frac{1}{4}$ wavelength from the respective connecting points $P_1$, $P_3$, $P_6$ and $P_7$. In FIG. 6, E designates the ground terminal.

In FIG. 7, $L_{1a}$, $P_{1a}$, $L_{4a}$, $P_{7a}$, $P_{8a}$, $E_a$, $P_{4a}$ and $P_{3a}$ are lead frames formed on the insulating substrate $I_b$ and clamped by an insulating frame $I_c$. W represents bonding wires. It consists of eight fine wires, but for the sake of simplicity only one of them is designated.

As shown in FIG. 7, the capacitor pairs $C_1$ and $C_5$, and $C_3$ and $C_6$ are mounted on the opposing ends of relatively wide lead frames $P_{1a}$ and $E_a$ respectively. In the same manner, the diode pairs $D_1$ and $D_2$, and $D_3$ and $D_4$ are mounted on the opposing ends of lead frames $P_{3a}$ and $P_{7a}$ respectively and these diodes are connected to corresponding capacitors $C_1$, $C_3$, $C_5$ and $C_6$ by four bonding wires.

With this construction, the loop of FIG. 4 comprising capacitor $C_3$, diodes $D_2$ and $D_1$, capacitors $C_1$ and $C_5$, diodes $D_3$ and $D_4$ and capacitor $C_6$ can be contained in a simple package.

As described above, according to this invention, the anode (or cathode) electrodes of two diodes are connected together, the cathode (or anode) electrode of one diode is grounded and the cathode (or anode) electrode of the other diode is connected to a source so as to forwardly bias one diode and reversely bias the other diode. Accordingly, it is possible to impart to the semiconductor device high frequency characteristics similar to those of a pin diode without utilizing the same and to fabricate diodes into an assembly operating similar to pin diodes using an epitaxially grown wafer but without utilizing a substrate having a high specific resistance. Accordingly, it is possible to reduce the thickness of the i layer and the driving power. This also makes it possible to widen the range of the specific resistance of the wafer. Moreover, it is possible to improve the crystaline structure and the reliability.

What is claimed is:

1. A high frequency semiconductor device comprising (a) a first capacitor connected between first and second connecting points, (b) a first diode connected between second and third connecting points, (c) a second diode connected between third and fourth connecting points, (d) a second capacitor connected between third and fifth connecting points, (e) a third capacitor connected between said fourth connecting point and a high frequency grounding point, (f) first circuit means including a resistance element and connected between said third connecting point and a first potential point, (g) second circuit means connected between said second connecting point and a first switching point, (h) third circuit means for connecting said fourth connecting point and a second switching point, and (i) switching means for transfer connecting one of said first and second switching points to said first potential point and the other switching point to a second potential point.

2. The high frequency semiconductor device according to claim 1 wherein said first potential point is at the ground potential and said second potential point is connected to a source.

3. The high frequency semiconductor device according to claim 1 wherein said second potential point is at the ground potential and said first potential point is connected to a source.

4. The high frequency semiconductor device according to claim 1 wherein a first high frequency blocking means is connected between said connecting point and said second first switching point, a second frequency blocking means is connected between said fourth connecting point and said second switching point, and a third high frequency blocking means and a resistance element are connected between said third connecting point and said first potential point.

5. The high frequency semiconductor device according to claim 1 wherein said circuit means for interconnecting said second connecting point and said first switching point comprises a high frequency transmission circuit which is short-circuited as a high frequency circuit as a point spaced from said second conecting point by an odd multiple of $\frac{1}{4}$ wavelength, and wherein said circuit means for interconnecting said third connecting point and said resistance element comprises a high frequency transmission circuit which is short-circuited as a high frequency circuit at a point spaced from said third connecting point by an odd multiple of $\frac{1}{4}$ wavelength.

6. A high frequency semiconductor device comprising (a) a first capacitor connected between first and second connecting points, (b) a first diode connected between second and third connecting points, (c) a second diode connected between third and fourth connecting points, (d) a second capacitor connected between third and fifth connecting point, (e) a third capacitor connected between the fourth connecting point and a high frequency grounding point, (f) first circuit means including a resistance element and connected between said third connecting point and a first potential point, (g) a fourth capacitor connected between said first connecting point and a sixth connecting point, (h) a third diode connected between sixth and seventh connecting points, (i) a fourth diode connected between seventh and eighth connecting points, (j) a fifth capacitor connected between seventh and ninth connecting point, (k) a sixth capacitor connected between said eighth connecting point and a high frequency grounding point, (1) second circuit means including a resistance element and connected between said seventh connecting point and said first potential point, (m) first high frequency blocking means connected between said fourth connecting means and a first switching point, (n) second high frequency blocking means connected between said sixth connecting point and said first switching point, (o) third high frequency blocking means connected between said second connecting point and a second switching point, (p) fourth high frequency blocking means connected between said eight connecting point and said second switching point and (q) switching means for transfer connecting one of said first and second switching points to said first potential point and the other to a second potential point.

7. A high frequency semiconductor device as claimed in claim 6, wherein:

said first connecting point and said high frequency grounding point comprise a first pair of relatively wide opposed conductors, said first and fourth capacitors being disposed on said relatively wide conductor comprising said first connecting point and each having a first terminal connected to said first connecting point and a second terminal, said third and sixth capacitors being disposed on said relatively wide conductor comprising said high frequency grounding point and each having a first terminal connected to said high frequency grounding point and a second terminal;

said third and seventh connecting points comprise a second pair of relatively wide opposed conductors disposed perpendicular to said first pair of relatively wide opposed conductors, said first and second diodes disposed on said relatively wide conductor comprising said third connecting point and each having a first terminal connected to said third connecting point and a second terminal, said third and fourth diodes disposed on said relatively wide conductor comprising said seventh connecting point and each having a first terminal connected to said seventh connecting point and a second terminal;

said second connecting point comprising a bonding wire connected between said second terminals of said first capacitor and said first diode;

said fourth connecting point comprising a bonding wire connected between said second terminals of said third capacitor and said second diode;

said sixth connecting point comprising a bonding wire connected between said second terminals of said fourth capacitor and said third diode; and said eighth connecting point comprising a bonding wire connected between said second terminals of said sixth capacitor and said fourth diode.

8. A high frequency semiconductor device comprising (a) a first capacitor connected between first and second connecting points, (b) a first diode connected between second and third connecting point, (c) a second diode connected between third and fourth connecting point, (d) a second capacitor connected between third and fifth connecting points, (e) a third capacitor connected between said fourth connecting point and a high frequency grounding point, (f) first circuit means including a resistance element and connected between said third connecting point and a first potential point, (g) a third diode connected between fifth and sixth connecting point, (h) a fourth diode connected between sixth and eighth connecting points, (j) a fifth capacitor connected between said seventh connecting point and said high frequency grounding point, second circuit means including a resistance element and connected between said sixth connecting point and said first potential point, (l) first high frequency blocking means connected between said second connecting point and a first switching point, (m) second high frequency blocking means connected between said fifth connecting point and said first switching point, (n) third high frequency blocking means connected between said fourth connecting point and a second switching point, (o) fourth high frequency blocking means connected between said seventh connecting point and said second switching point, and (p) switching means for transfer connecting one of said first and second switching points to said first potential point and the other to a second potential point.

* * * * *